United States Patent
Wu et al.

(10) Patent No.: US 7,826,262 B2
(45) Date of Patent: Nov. 2, 2010

(54) OPERATION METHOD OF NITRIDE-BASED FLASH MEMORY AND METHOD OF REDUCING COUPLING INTERFERENCE

(75) Inventors: Guan-Wei Wu, Hsinchu (TW); I-Chen Yang, Hsinchu (TW); Yao-Wen Chang, Hsinchu (TW)

(73) Assignee: Macronix International Co., Ltd, Hsinchu (TW)

( * ) Notice: Subject to any disclaimer, the term of this patent is extended or adjusted under 35 U.S.C. 154(b) by 134 days.

(21) Appl. No.: 12/167,464

(22) Filed: Jul. 3, 2008

(65) Prior Publication Data

US 2009/0180332 A1    Jul. 16, 2009

Related U.S. Application Data

(60) Provisional application No. 61/020,370, filed on Jan. 10, 2008.

(51) Int. Cl.
  *G11C 16/04* (2006.01)
(52) U.S. Cl. ............... 365/185.02; 365/185.18; 365/185.24; 365/185.27
(58) Field of Classification Search ........... 365/185.02
  See application file for complete search history.

(56) References Cited

U.S. PATENT DOCUMENTS

| | | | | |
|---|---|---|---|---|
| 5,715,194 | A * | 2/1998 | Hu | 365/185.17 |
| 6,731,544 | B2 * | 5/2004 | Han et al. | 365/185.28 |
| 6,747,899 | B2 * | 6/2004 | Hsia et al. | 365/185.28 |
| 7,075,828 | B2 * | 7/2006 | Lue et al. | 365/185.24 |
| 7,133,313 | B2 * | 11/2006 | Shih | 365/185.18 |
| 7,187,590 | B2 * | 3/2007 | Zous et al. | 365/185.3 |
| 7,209,390 | B2 * | 4/2007 | Lue et al. | 365/185.19 |
| 7,212,435 | B2 * | 5/2007 | Rudeck et al. | 365/185.02 |
| 7,221,589 | B2 * | 5/2007 | Li | 365/185.17 |
| 7,345,920 | B2 * | 3/2008 | Yeh | 365/185.21 |
| 7,471,568 | B2 * | 12/2008 | Wu | 365/185.24 |
| 7,486,567 | B2 * | 2/2009 | Wu | 365/185.28 |
| 7,599,229 | B2 * | 10/2009 | Wu | 365/185.3 |
| 7,619,933 | B2 * | 11/2009 | Sarin | 365/185.28 |
| 7,643,338 | B2 * | 1/2010 | Lee | 365/185.02 |
| 2005/0047210 | A1 * | 3/2005 | Matsunaga et al. | 365/185.17 |
| 2009/0080262 | A1 * | 3/2009 | Park | 365/185.18 |

OTHER PUBLICATIONS

Article titled "The Impact of Interference on Multi-Level-Cell Applications in Scaled Nitride-Storage Flash Memory" authored by Yang, et al., This paper appears in: Non-Volatile Semiconductor Memory Workshop, 2008 and 2008 International Conference on Memory Technology and Design. NVSMW/ICMTD 2008. Joint, May 18-22, 2008 (pp. 124-125).

* cited by examiner

*Primary Examiner*—Son L Mai
(74) *Attorney, Agent, or Firm*—J.C. Patents

(57) ABSTRACT

A method for operating a nitride-based flash memory is provided. The operation method includes pre-performing an interference reduction operation (IRO) before the routine programming operating step. Through bias arrangement of the target memory cell, charges are injected into the charge trapping layer mainly above the junction regions of the memory cell before programming so as to reset the influences caused by coupling interference issues. The operation method of this present invention not only reduces coupling interference but also afford a wider operation window.

23 Claims, 8 Drawing Sheets

OPERATION METHOD OF NITRIDE-BASED FLASH MEMORY AND METHOD OF REDUCING COUPLING INTERFERENCE

CROSS-REFERENCE TO RELATED APPLICATION

This application claims the benefit of U.S. provisional application No. 61/020,370, filed on Jan. 10, 2008. The entirety of the above-mentioned patent application is hereby incorporated by reference herein and made a part of this specification.

BACKGROUND OF THE INVENTION

1. Field of the Invention

The present invention relates to an operation method for a non-volatile memory structure; in particular, to an operation method for a nitride-based flash memory and a method for reducing coupling interference of a nitride-based flash memory.

2. Description of Related Art

In general, the non-volatile memory cell is comprised of a stacked gate, made of doped polysilicon and consisting of a floating gate and a control gate. A dielectric layer is disposed between the floating gate and the control gate, while a tunnel oxide layer is located between the floating gate and the substrate. The floating gate is disposed between the substrate and the control gate and in a "floated" state (i.e. not being electrically connected with any circuit). The control gate is electrically connected with the word line. The floating gate is used to store charges, while the control gate is used to control a data writing/reading operation. The memory cell having the floating gate structure can be used as one bit/cell, single level cell (SLC) or multi-level cell (MLC). As the floating gate based memory cell is continuingly scaled down and the distance between each two word-lines becomes too close, the coupling interference issues occur and result in a threshold voltage shift (Vt shift), which is one major problem faced in the industry.

In addition to the aforementioned floating-gate-based memory cell, a nitride-based memory cell that uses silicon nitride to be a charge trapping layer as a replacement for the polysilicon floating gate has become another mainstream non-volatile memory cell. Despite that the nitride-based memory cell can store 2 or more bits per cell and its fabrication is compatible with MOS technology, the nitride-based memory cell was formerly assumed free of coupling interference issues.

However, it is found that the nitride-based memory structure has similar coupling interference issues. Referring to FIG. 1, FIG. 1 is a diagram illustrating a relationship between currents and voltages measured when performing a reading operation on two different sized memory cells and applying a negative bias voltage to word lines at two sides of the memory cell. In FIG. 1, -■- represents the measurement results of the currents and the voltages according to a smaller sized memory cell D2; -●-represents the measurement results of the currents and the voltages according to a bigger sized memory cell D1; X axis represents a gate voltage (VG); and Y axis represents a read current. As shown in FIG. 1, after the size of the memory cell is miniaturized, which means a spacing between each two adjacent word lines is shorten, the read current is more prone to be impacted by the bias change of adjacent word lines.

Referring to FIG. 2A and FIG. 2B, FIG. 2A and FIG. 2B are a top view of a word line layout and a diagram illustrating a relationship between bit counts and Vt shift values for different word lines respectively. FIG. 2A illustrates 8 word lines WL0~WL7 arranged in parallel, wherein the critical dimension of the word lines is 75 nm. In FIG. 2B, -○- represents a voltage distribution curve as a whole, and -●-·-▲-·-▼- and -♦- are the voltage distribution curves for the word lines WL1, WL3, WL5 and WL7 respectively. As shown in FIG. 2A and FIG. 2B, when the bits of the word lines WL0, WL2, WL4 and WL6 are programmed to reach a "0" state, the Vt shift values of the adjacent word lines WL1, WL3, WL5 and WL7 increase.

From the experiment results, when scaling down the size of the memory cell, if the distance between each two adjacent word lines is too close, the coupling interference issue of the nitride-based memory cell arises. Moreover, it is known from FIG. 2A and FIG. 2B that the Vt shift values of the word lines, WL1, WL3 and WL5 which have interference from two sides are bigger, while the Vt shift value of the word line WL7 which has interference from one side is smaller.

FIG. 3 is a Vt distribution diagram for the nitride-based memory cell without consideration of the coupling interference issue (shown in dotted line) and in consideration of the coupling interference issue respectively. As shown in FIG. 3, the coupling interference makes the Vt where the data storage state is "1" shift from the curve 310 to the curve 312, and makes the Vt where the data storage state is "0" shift from the curve 320 to the curve 322. Hence, the operation window W becomes relatively narrower than the operation window W0.

As the coupling interference issue existing in the nitride-based memory makes the operation window narrower, it is desirable to reduce or mitigate the coupling interference issue for the development of better quality or smaller sized non-volatile memory.

SUMMARY OF THE INVENTION

The present invention is directed to an operation method for a nitride-based flash memory and a method for reducing the coupling interference of the nitride-based flash memory, by performing an interference reduction operation (IRO) before the programming operation step. Through bias arrangement of the memory cell, charges are mainly injected into the charge trapping or storage layer above the junction regions of the memory cell, which can reduce the coupling interference of the nitride-based flash memory.

The present invention provides an operation method for a nitride-based flash memory having a plurality of memory cells. The method includes performing an interference reduction operation by applying a gate voltage $V_G$ to the control gate of a selected memory cell, applying a first source/drain voltage and a second source/drain voltage respectively to the two doped regions, and applying a substrate voltage $V_B$ to the substrate to reduce the gate-to-substrate voltage $V_{GB}$, so as to inject charges into the charge trapping layer mainly above the junction regions of the memory cell, and subsequently programming the selected memory cell.

According to an embodiment of the present invention, for the operation method, the first source/drain voltage is equivalent to the second source/drain voltage, and an absolute value of the substrate voltage $V_B$ is smaller that of the gate voltage $V_G$.

According to an embodiment of the present invention, for the operation method, the first source/drain voltage is 0 volt and the second source/drain voltage is 0 volt, the gate voltage $V_G$ is a first negative voltage, the substrate voltage $V_B$ is a zero voltage or a second negative voltage.

In accordance with this invention, the absolute value of the gate voltage $V_G$ should be smaller than the absolute value of the effective Fowler-Nordheim tunneling voltage of the memory cell, while the absolute values of the source/drain-to--substrate voltages $V_{DB}$ and $V_{SB}$ should be smaller than the absolute value of the junction breakdown voltage of the memory cell.

The present invention further provides a method for reducing the coupling interference of a nitride-based flash memory having a plurality of memory cells, comprising performing an interference reduction operation (IRO) by applying a first negative voltage to the control gate of a selected memory cell, grounding the two doped or 0 volt regions, and applying a zero voltage or a second negative voltage to the substrate but keep the source/drain-to-substrate voltages $V_{SB}$ and $V_{DB}$ should be smaller than the absolute value of the junction breakdown voltage, so as to inject electrons into the charge trapping layer mainly above the junction regions of the memory cell via negative Fowler-Nordheim tunneling effects and subsequently programming the selected memory cell.

According to an embodiment of the present invention, the absolute value of the first negative voltage is larger than that of the second negative voltage.

According to an embodiment of the present invention, the first negative voltage is about −10 volt to about −13 volt, while the second negative voltage is about −0.5 volt to about −4 volt when junction breakdown voltage is 5V.

According to an embodiment of the present invention, the interference reduction operation (IRO) of the operation method can be a negative Fowler-Nordheim tunneling operation (−FN operation), as electrons are injected into the charge trapping layer via negative Fowler-Nordheim tunneling effects.

In accordance with this invention, for the −FN operation, the absolute value of the gate voltage $V_G$ should be smaller than the absolute value of the effective negative Fowler-Nordheim tunneling voltage of the memory cell, while the absolute values of the source/drain-to-substrate voltages $V_{SB}$ and $V_{DB}$ should be smaller than the absolute value of the junction breakdown voltage of the memory cell.

In the operation method of the present invention, by performing the interference reduction operation to the memory cell before the common programming operation reading operation, charges are injected into the storage layer mainly above the junction regions of the selected memory cell, thereby reducing the coupling interference. Hence, the threshold voltage shift caused by coupling interferences can be mitigated and wider operation windows are provided for the reading operation of the flash memory.

In order to make the above and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
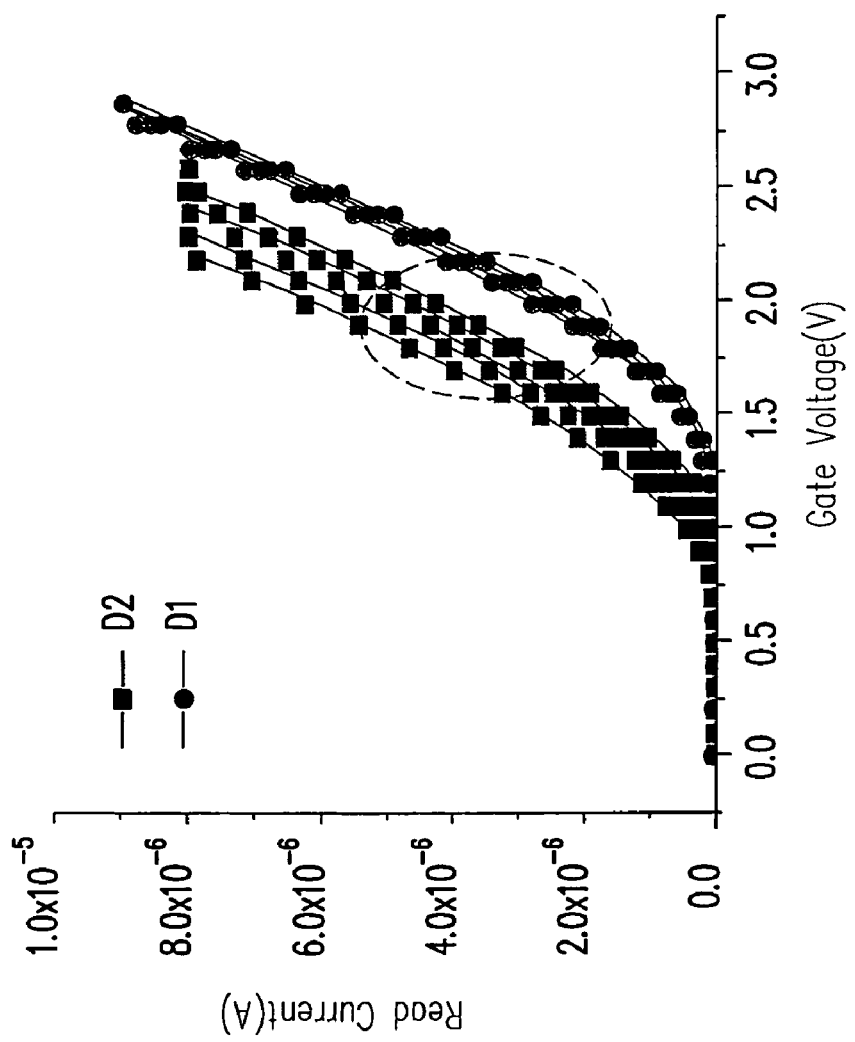
FIG. 1 is a diagram illustrating a relationship between currents and voltages measured when performing a reading operation on two different sized memory cells and applying a negative bias voltage to word lines at two sides of the memory cell.
Figure 2A:
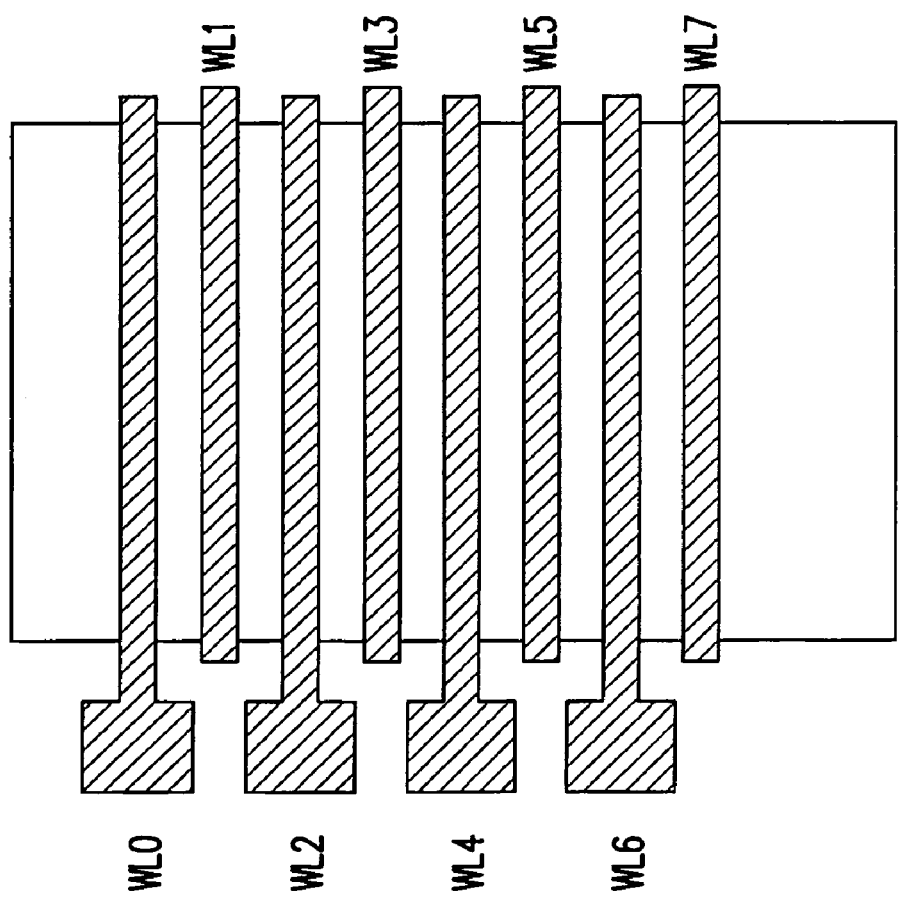
FIG. 2A is a top view of a word line layout of the memory.
Figure 2B:
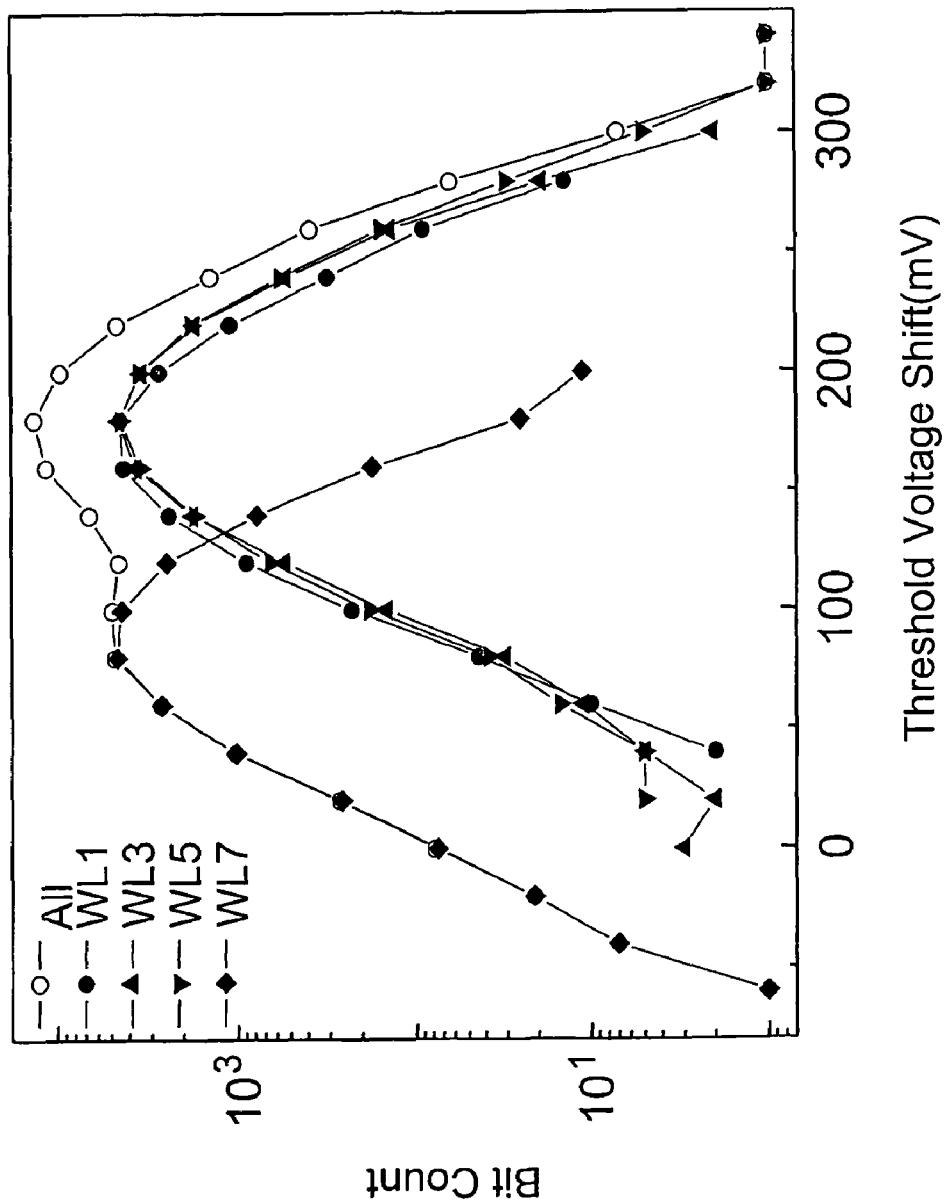
FIG. 2B is a diagram illustrating a relationship between bit counts and threshold voltage shift values for different word lines.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
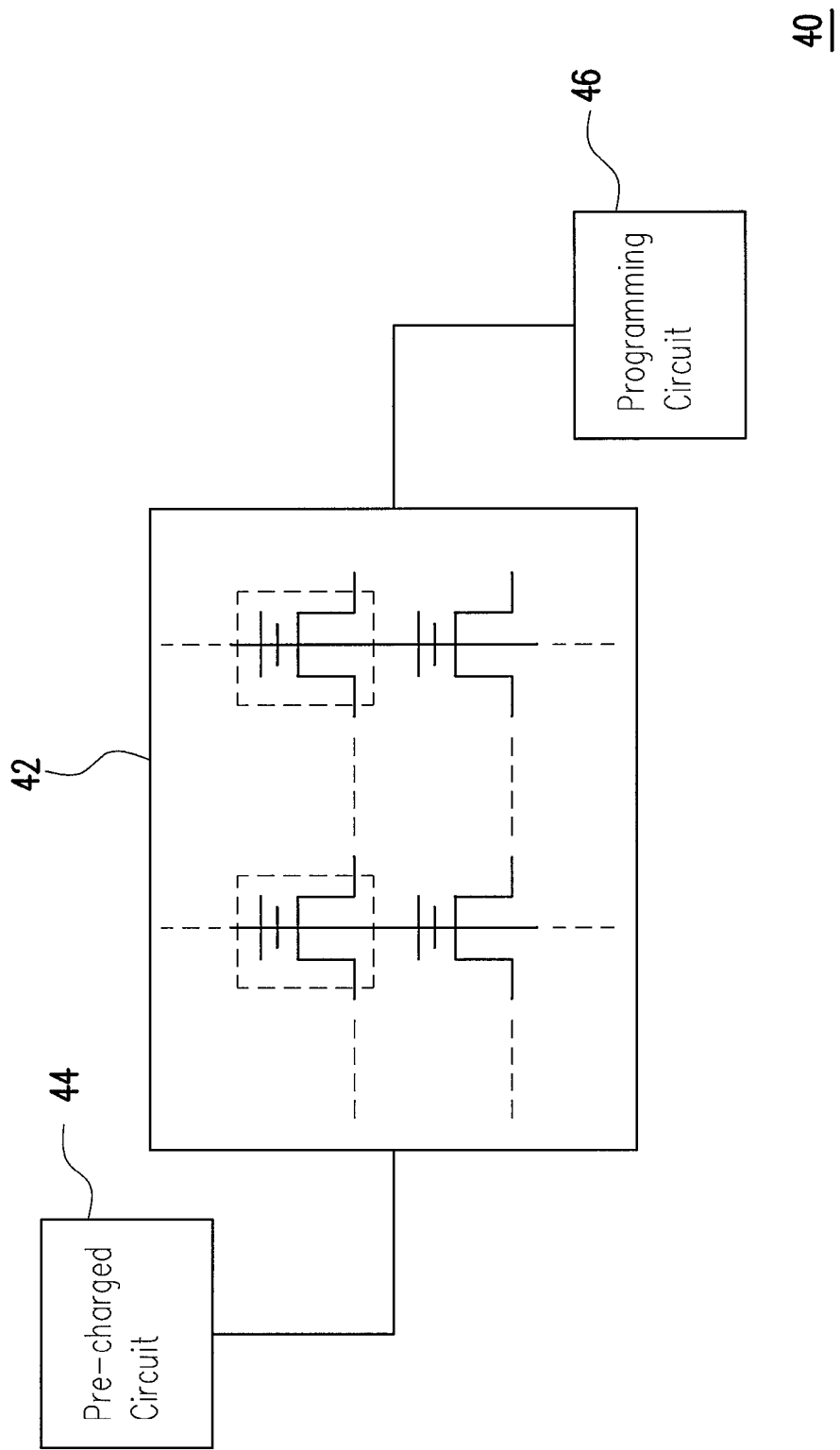
FIG. 4A is a schematic circuit diagram showing a non-volatile memory of the present invention.

FIG. 4A is a schematic circuit diagram showing a non-volatile memory of the present invention. The non-volatile memory 40 includes a plurality of memory cells 42, either arranged in arrays or rows, a pre-charged circuit 44 and a programming circuit. The memory cell 42 generally includes at least a gate, a source region and a drain region in a substrate. An example of the detailed structure of the memory cell will be discussed in the following sections. However, the memory cell of this invention is not limited to the structure described herein, and possible modifications should be encompassed within the scope of the present invention. The pre-charged circuit 44 can apply a gate voltage $V_G$ to the gate, applying a source voltage and a drain voltage respectively to the source region and drain region, and applying a substrate voltage $V_B$ to the substrate, so that a gate induced drain leakage (GIDL) current is induced. In addition, the programming circuit can perform programming to alter the logic state of the memory cell.

Figure 4B:
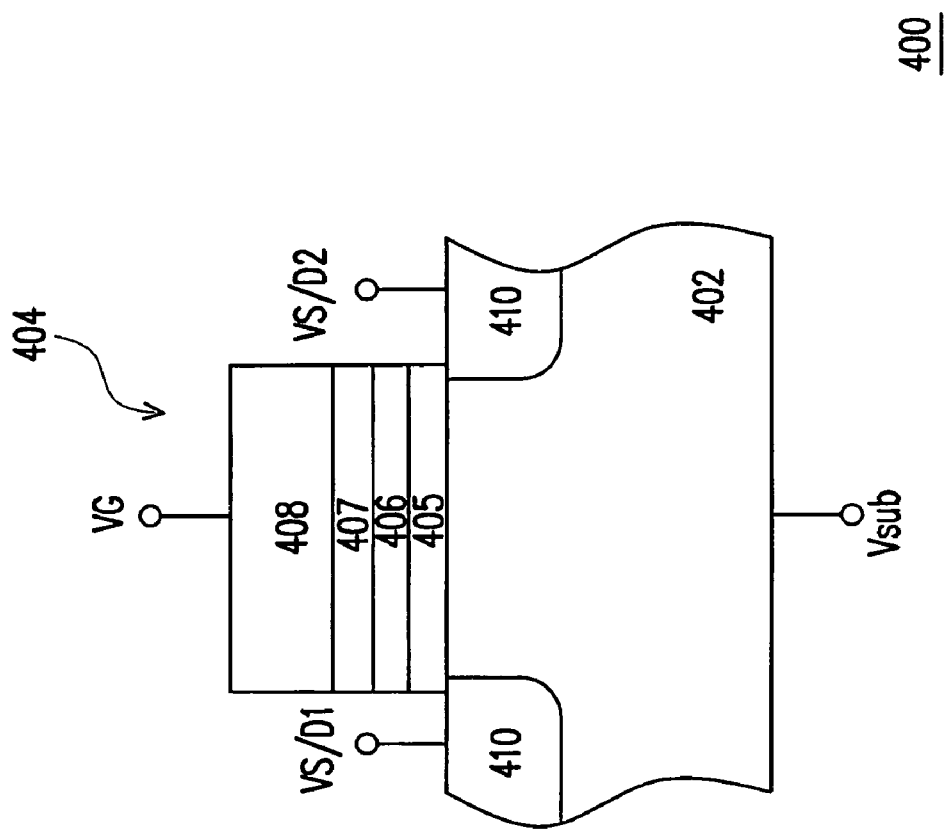
FIG. 4B is a cross-sectional schematic view of a non-volatile memory cell according to one embodiment of the present invention.

FIG. 4B is a cross-sectional schematic view of a non-volatile memory cell according to one embodiment of the present invention. The structures of the memory cell in the following figures are merely exemplary, not used to limit this present invention.

Referring to FIG. 4B, the memory cell 400 of this embodiment is a nitride-based flash memory cell comprising a substrate 402, a stacked gate structure 404 consisting of, from bottom to top, a charge tunneling layer 405, a charge trapping layer 406, a charge barrier layer 407 and a control gate 408, and two doped regions 410. The stacked gate structure 404 is disposed on the substrate 402, and the doped regions 410 are buried in the substrate 402 and disposed on both sides of the stacked gate structure 404. The two doped regions 410 respectively serve as a source region and a drain region of the memory cell 400 and are a part of the buried bit lines of the memory array. The material of the control gate 408 is, for example, doped polysilicon. The material of the charge barrier layer 407 can be a layer of silicon oxide or silicon-rich oxide with a refractive index larger than about 1.46, with a thickness of about 7 nm to 12 nm, for example. The charge trapping layer 406 of this embodiment is, for example, a nitride-based material layer with a thickness of about 6.5 nm to 9 nm, wherein the material of the nitride-based material layer is, for example, silicon nitride, silicon oxynitride, or high-k materials (such as, $Ta_2O_5$, $TiO_2$, $HfO_2$, $ZrO_2$), or any other nitride material capable of trapping charges therein. The charge tunneling layer 405, disposed on the substrate 402 under the charge trapping layer 406, can be a layer of silicon oxide or silicon-rich oxide with a refractive index larger than about 1.46, with a thickness of about 4 nm to 5 nm, for example.

It is known that flash memory can perform programming, erasing and many times and retain information even when power is interrupted. Taking the SONOS flash memory cell for two bits operation as an example, it is commonly programmed by channel hot-electron (CHE) and is erased by band-to-band tunneling hot-hole. Table 1 illustrate an example of the operation method for programming, reading and erasing the SONOS flash memory cell according to the preferred embodiment of the present invention respectively.

TABLE 1

|  | Program | Read | Erase |
| --- | --- | --- | --- |
| Gate | $V_G$ | $V_{CC}$ | $-V_G$ |
| Source region | Ground | Ground | Ground |
| Drain region | $V_D$ | $V_D$ | $V_D$ |
| P-well | Ground | Ground | Ground |

Regarding the coupling interference issues existing in the nitride-based flash memory when scaling down the memory cell, the present invention provides a new operation method for reducing the coupling interference. The operation method of the present invention is described hereinafter with reference to FIG. 4B.

Referring to FIG. 4B, the operation method of a memory in this embodiment principally includes performing an interference reduction operation (IRO) for injecting charges to the charge trapping layer 406 mainly above the junctions between the doped regions 410 and the substrate 402, before the routine or common programming operation. The interference reduction operation (IRO) can be performed through the bias arrangement of the memory cell. By way of performing IRO, the charges stored in the charge trapping layer mainly above the junction regions can reduce or compensate the coupling interference effects. For example, for the N-type doped regions, the interference reduction operation (IRO) can be a negative Fowler-Nordheim tunneling operation (−FN operation), as electrons are injected into the charge trapping layer via negative Fowler-Nordheim tunneling by the bias arrangement. Alternatively, for the P-type doped regions, the interference reduction operation (IRO) can be a positive Fowler-Nordheim tunneling operation (+FN operation).

According to one embodiment of this invention, the aforementioned −FN operation comprises that a gate voltage $V_G$ is applied to a control gate 408 of the target memory cell 400, source/drain voltages VS/D1 and VS/D2 are applied to two doped regions 410 respectively, and a substrate voltage $V_B$ is applied to the substrate 402 so as to inject electrons into the charge trapping layer 406 mainly above the junction between the doped region 410 and the substrate 402 of the memory cell 400. Principally, during the −FN operation, a negative bias is applied to the gate, while the source/drain are grounded and a zero or small negative bias is applied to the substrate. In accordance with this invention, for the −FN operation, the absolute value of the gate voltage $V_G$ should be smaller than the absolute value of the effective negative Fowler-Nordheim tunneling voltage of the memory cell, while the absolute values of the source/drain-to-substrate voltages VSB and VDB should be smaller than the absolute value of the junction breakdown voltage of the memory cell. That is, if the effective negative Fowler-Nordheim tunneling voltage of the memory cell is, for example, −15V, the gate voltage $V_G$ could be −8V to −12V, or if the junction breakdown voltage of the memory cell is, for example, 5V, the substrate voltage $V_B$ could be −0.5V to −4V with grounding source/drain voltage. Depending on the size or design of the memory cell, the effective negative Fowler-Nordheim tunneling voltage or the junction breakdown voltage of the memory cell may lie in different ranges as described above. Taking the thickness of the charge tunneling layer as an example, Fowler-Nordheim tunneling effect depends on electric field across this charging tunneling layer, and tunneling current increases rapidly with the electric field, thus placing a limit on minimum layer thickness. The effective negative Fowler-Nordheim tunneling voltage of the memory cell provides around 10 MV/cm of electric field across the charge tunneling layer, and it is positively proportional to the thickness of the charge tunneling layer, and the thickness of the charge tunneling layer may be varied depending on the device design considerations or requirements. However, the scopes of this invention encompass possible variations or modifications of concurring or compatible parameters or structures.

The following examples are merely some of the workable models of the −FN operation according to this invention, but are not intended to limit the scope of this invention. Example 1: the gate voltage $V_G$ is −10 volt, the source/drain voltage VS/D1 and the source/drain voltage VS/D2 are, for example, 0 volt, while the substrate voltage $V_B$ is 0 volt. Example 2: the gate voltage $V_G$ is −10 volt, the source/drain voltage VS/D1 and the source/drain voltage VS/D2 are, for example, 0 volt, while the substrate voltage $V_B$ is −2 volt. Example 3: the gate voltage $V_G$ is −10 volt, the source/drain voltage VS/D1 and the source/drain voltage VS/D2 are, for example, 0 volt, while the substrate voltage $V_B$ is −4 volt.

Figure 5B:
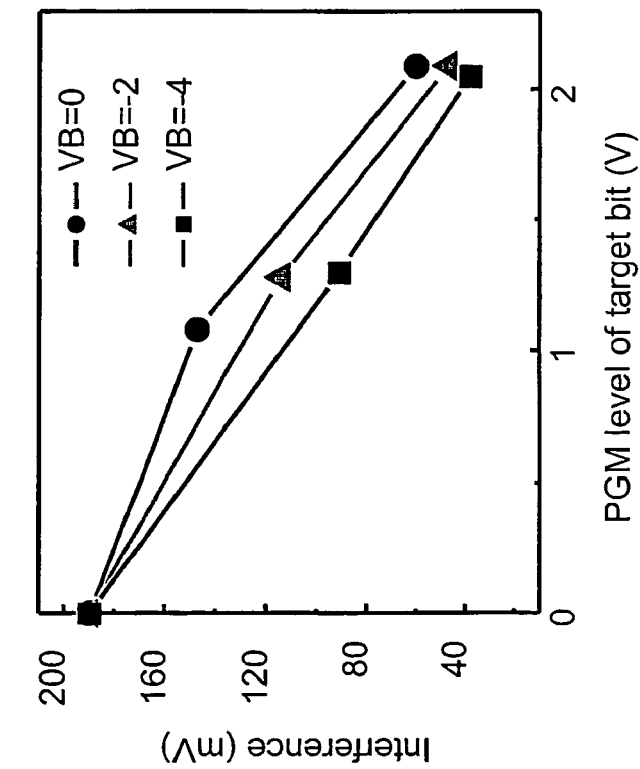
FIG. 5B shows a diagram illustrating the interferences of the memory cell.
Figure 5A:
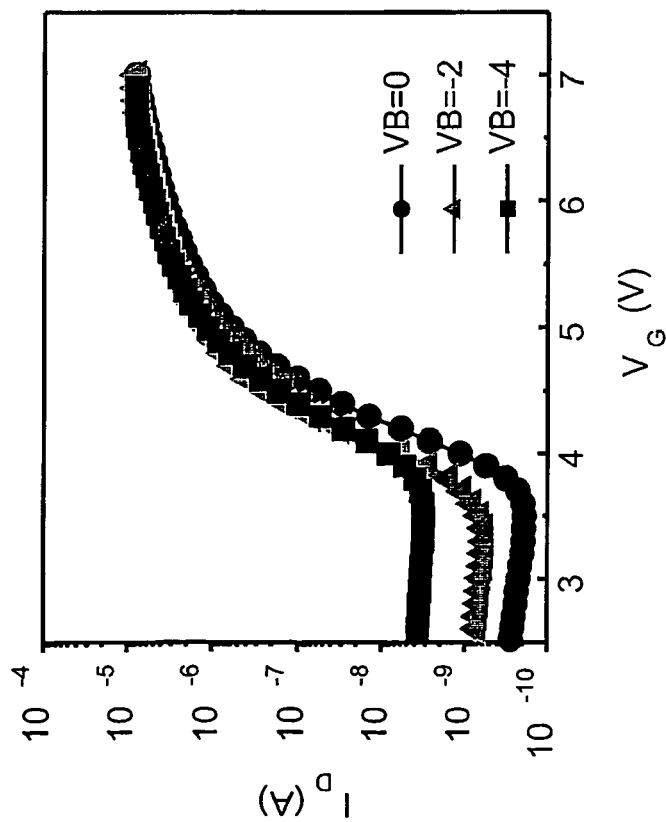
FIG. 5A shows a diagram illustrating the curves of drain current ($I_D$) versus gate voltage ($V_G$) for a memory cell.

FIG. 5A shows a diagram illustrating the curves of drain current ($I_D$) versus gate voltage ($V_G$) for a 65 nm-node SONOS memory cell with the pre-performed −FN operation under the parameters of examples 1-3, as the programming voltage (gate voltage) is increased. FIG. 5B shows a diagram illustrating the interferences of the memory cell. As shown in FIG. 5A, the higher gate induced drain leakage (GIDL) current is observed as the substrate voltage ($V_B$) becomes larger (more negative). FIG. 5B shows that less interference is observed with the more negative substrate voltage ($V_B$). As the GIDL current at the source/drain side is related to the charges stored location in the charge trapping layer, it indicates that more charges are stored in the charge trapping layer above the junction regions. Simultaneously, more stored charges lead to less interference as the charges stored above the junction regions suppress or compensate for the coupling interferences.

It should be noted that even the pre-performed −FN operation with a zero $V_B$ still can reduce coupling interferences and mitigate the influences of the interferences during performing the programming operation in the selected memory cell.

Figure 3:
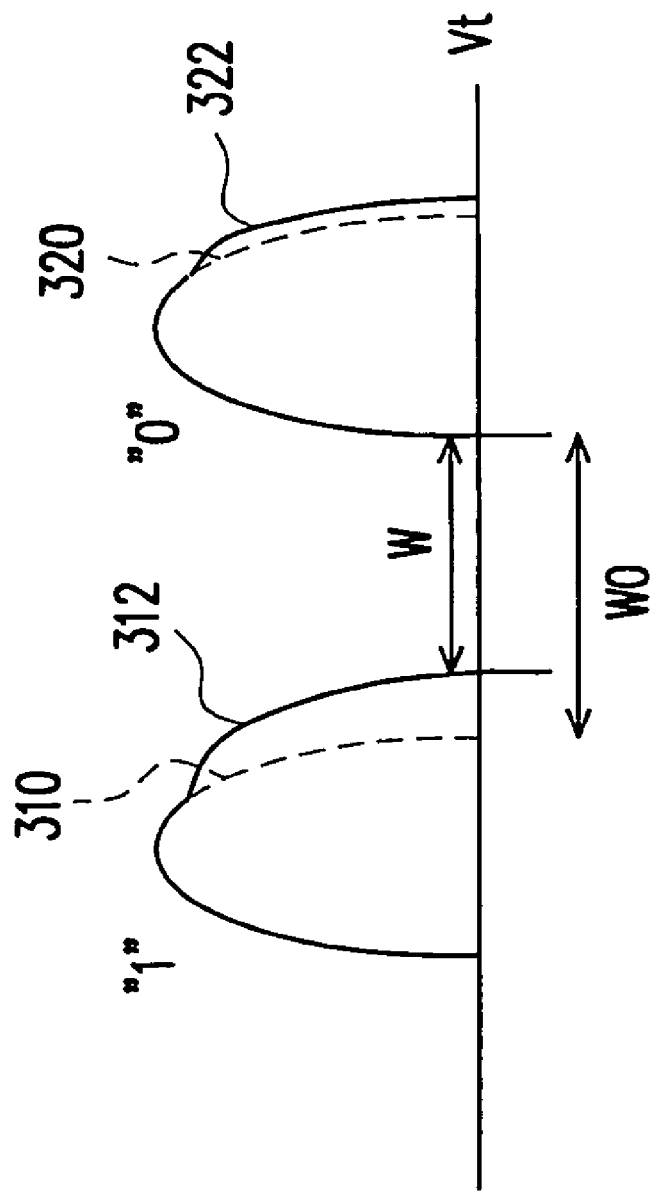
FIG. 3 is a threshold voltage distribution diagram of the nitride-based memory cell without or in consideration of the coupling interference issue.
Figure 6:
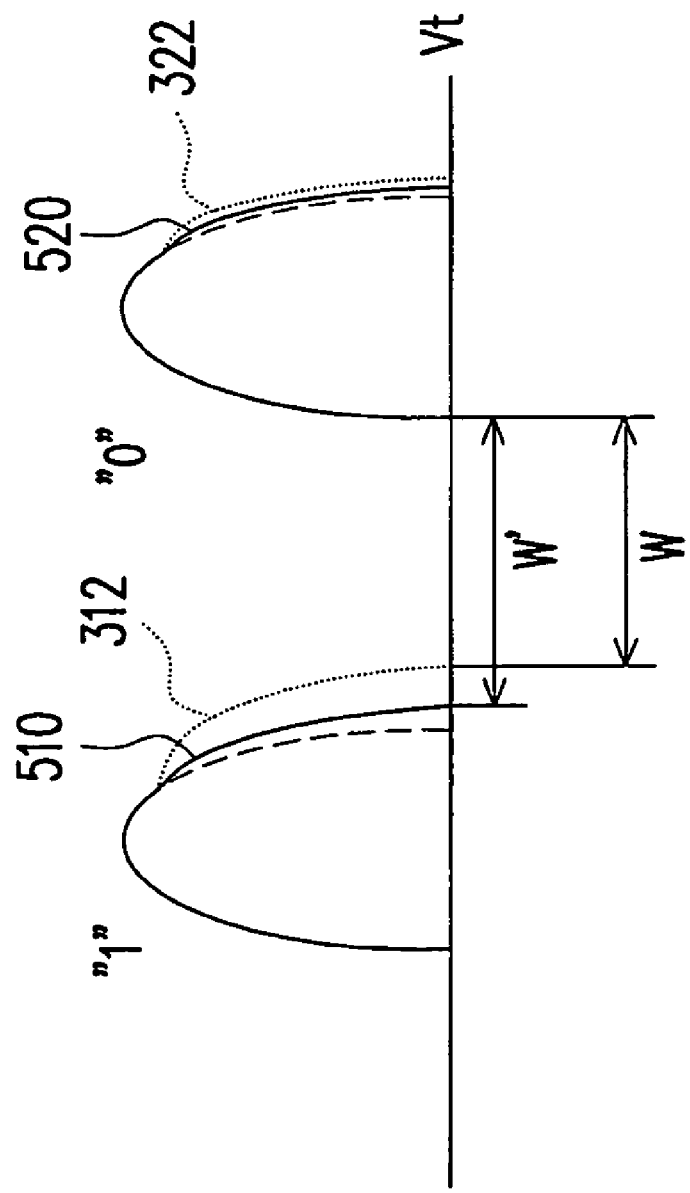
FIG. 6 is a threshold voltage (Vt) distribution diagram of the memory cell with the operation method of the present invention.

FIG. 6 is a threshold voltage (Vt) distribution diagram of the memory cell using the operation method of the present invention. In FIG. 6, the Vt distribution diagram in FIG. 3 is displayed in dotted line therein for comparison.

As shown in FIG. 6, with the pre-performed interference reduction operation (IRO) provided by the present invention, because the coupling interference is alleviated, the Vt where the data storage state is "1" shifts to the curve 510 and the Vt where the data storage state is "0" shifts to the curve 520. By comparing the Vt distribution curves 510 and 312 and the Vt distribution curves 520 and 322, it is clear that the coupling interference is significantly reduced. It should be mentioned that the coupling interference issue will have different influences to different data storage states of the nitride-based memory structure. For the data storage state "1", the shift of the threshold voltage is larger and the interference is thus mitigated to a greater degree. For the data storage state "0", the shift of the Vt is smaller and the interference is mitigated to a lesser degree. Compared with the operation window W shown in FIG. 3, an operation window W' obtained by using the method of the present invention is wider by reducing the coupling interference.

The interference reduction operation (IRO) of the operation method in the present invention can be applied to one-time programming, multiple time programming, nitride-based memory or flash memory. Moreover, the operation method of this invention can be applied not only to the 2 bits/cell nitride-based memory cell, but also to single level and multi-level nitride-based memory cells.

In summary, the operation method of the present invention can reduce the coupling interference, thereby preventing the Vt voltage from being increased and affecting the operation of the devices and obtaining a bigger operation window. As a result, the method of the present invention can help lighten potential challenges of further miniaturization of the memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a memory on a substrate:
providing a selected memory cell having a gate comprising a charge trapping layer, a source region, and a drain region;
applying a gate voltage to the gate, applying a source voltage and a drain voltage respectively to the source region and drain region, and applying a substrate voltage to the substrate, so as to inject a predetermined amount of charges into the charge trapping layer above junction regions of the memory cell but not sufficient to cause alternation of logic state of the selected memory cell, and
programming the selected memory cell.

2. The method of claim 1, wherein the source voltage is equivalent to the drain voltage, and an absolute value of the substrate voltage is smaller that of the gate voltage.

3. The method as claimed in claim 1, wherein the source voltage is 0 volt and the drain voltage is 0 volt.

4. The method as claimed in claim 1, wherein the gate voltage is a first negative voltage, the substrate voltage is a zero voltage or a second negative voltage.

5. The method as claimed in claim 4, wherein the absolute value of the first negative voltage is smaller than that of an effective Fowler-Nordheim tunneling voltage of the memory cell.

6. The method as claimed in claim 4, wherein the absolute value of a source-to-substrate voltage or a drain-to-substrate voltage is smaller than that of a junction breakdown voltage of the memory cell.

7. The method as claimed in claim 4, wherein the first negative voltage is about −10 volt to about −15 volt, while the second negative voltage is about −0.5 volt to about −4 volt.

8. A method for operating a memory on a substrate:
providing a memory cell comprising a gate, a source region, and a drain region;
applying a gate voltage $V_G$ to the gate, applying a source voltage $V_S$ and a drain voltage $V_D$ respectively to the source region and the drain region, and applying a substrate voltage $V_B$ to the substrate to cause a gate induced drain leakage (GIDL) current but not sufficient to cause alternation of logic state of the memory cell; and
programming the memory cell.

9. The method of claim 8, wherein the source voltage $V_S$ is equivalent to the drain voltage $V_D$, and an absolute value of the substrate voltage $V_B$ is smaller that of the gate voltage $V_G$.

10. The method as claimed in claim 8, wherein the gate voltage $V_G$ is a first negative voltage, the substrate voltage $V_B$ is a zero voltage or a second negative voltage.

11. The method as claimed in claim 10, wherein the absolute value of the first negative voltage is smaller than that of an effective Fowler-Nordheim tunneling voltage of the memory cell.

12. The method as claimed in claim 10, wherein a GIDL current when the substrate voltage $V_B$ is the second negative voltage is at least 10 times higher than a GIDL current when the substrate voltage $V_B$ is 0 volt.

13. The method as claimed in claim 8, wherein the absolute value of a source-to-substrate voltage or a drain-to-substrate voltage is smaller than that of a junction breakdown voltage of the memory cell.

14. A non-volatile memory comprising:
a selected memory cell comprising a gate, a source region and a drain region in a substrate;
a pre-charged circuit for applying a gate voltage to the gate, applying a source voltage and a drain voltage respectively to the source region and drain region and applying a substrate voltage to the substrate to cause a gate induced drain leakage (GIDL) current to a predetermined value but not sufficient to cause alternation of logic state of the selected memory cell, and
a programming circuit for altering a logic state of the selected memory cell.

15. The non-volatile memory of claim 14, wherein the selected memory cell is a nitride-based flash memory cell, the gate is a stacked gate structure consisting of a charge tunneling layer, a charge trapping layer, a charge barrier layer and a control gate.

16. The non-volatile memory of claim 14, wherein the charge trapping layer comprises a silicon oxide/silicon nitride/silicon oxide (ONO) layer.

17. The non-volatile memory of claim 14, wherein the non-volatile memory is a not-OR (NOR) flash memory.

18. The non-volatile memory of claim 14, wherein the non-volatile memory is a not-AND (NAND) flash memory.

19. The non-volatile memory of claim 14, wherein the source voltage is equivalent to the drain voltage, and an absolute value of the substrate voltage is smaller that of the gate voltage.

20. The non-volatile memory of claim 14, wherein the gate voltage is a first negative voltage, the substrate voltage is a zero voltage or a second negative voltage.

21. The non-volatile memory of claim 20, wherein the absolute value of the first negative voltage is smaller than that of an effective Fowler-Nordheim tunneling voltage of the selected memory cell.

22. The non-volatile memory of claim 20, wherein a GIDL current when the substrate voltage is the second negative voltage is at least 10 times higher than a GIDL current when the substrate voltage is 0 volt.

23. The non-volatile memory of claim 14, wherein the absolute value of a source-to-substrate voltage or a drain-to-substrate voltage is smaller than that of a junction breakdown voltage of the selected memory cell.

* * * * *